(12) United States Patent
Fukada

(10) Patent No.: US 6,922,328 B2
(45) Date of Patent: Jul. 26, 2005

(54) SEMICONDUCTOR DEVICE AND METHOD FOR MANUFACTURING THE SAME

(75) Inventor: Shinichi Fukada, Tokyo (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/849,147

(22) Filed: May 20, 2004

(65) Prior Publication Data

US 2005/0013089 A1 Jan. 20, 2005

(30) Foreign Application Priority Data

May 28, 2003 (JP) ........................................ 2003-151171

(51) Int. Cl.[7] .............................................. H01G 4/228
(52) U.S. Cl. ................ 361/306.2; 361/304; 361/301.4; 257/758; 257/759; 438/250; 438/253
(58) Field of Search ......................... 361/306.2, 301.4, 361/304; 257/758, 759; 438/250, 253, 256

(56) References Cited

U.S. PATENT DOCUMENTS

| | | | |
|---|---|---|---|
| 6,190,957 B1 * | 2/2001 | Mochizuki et al. | 438/240 |
| 6,521,528 B1 * | 2/2003 | Asamura | 438/655 |
| 6,699,726 B2 * | 3/2004 | Hidaka et al. | 438/3 |
| 6,744,085 B2 * | 6/2004 | Maruyama et al. | 257/295 |

FOREIGN PATENT DOCUMENTS

| | | |
|---|---|---|
| JP | A 02-154389 | 6/1990 |
| JP | A 07-115141 | 5/1995 |
| JP | A 07-235648 | 9/1995 |
| JP | A 07-235678 | 9/1995 |
| JP | A-9-116107 | 5/1997 |
| JP | A 2002-026283 | 1/2002 |
| JP | A 2003-123465 | 4/2003 |
| JP | A 2003-168783 | 6/2003 |

* cited by examiner

*Primary Examiner*—Dean A. Reichard
*Assistant Examiner*—Nguyen T. Ha
(74) *Attorney, Agent, or Firm*—Oliff & Berridge, PLC

(57) ABSTRACT

The invention provides a semiconductor device and a method for manufacturing the same that are capable of contributing to a further chip downsizing in the cross-point FeRAM. More particularly, a first local wiring can be formed on a first interlayer insulating layer so as to connect a drain region and part of a gate electrode in a MOS transistor and a top layer wiring. A second local wiring can be formed on a second interlayer insulating layer so as to connect a source region in the MOS transistor and a lower electrode layer in a ferroelectric capacitor, and further to connect part of a gate electrode in the MOS transistor and the top layer wiring. The MOS transistor that makes up of a peripheral circuitry using only the first and second local wiring can be formed directly under a capacitor array forming region of cross-point FeRAM.

8 Claims, 3 Drawing Sheets

SEMICONDUCTOR DEVICE AND METHOD FOR MANUFACTURING THE SAME

BACKGROUND OF THE INVENTION

1. Field of Invention

The invention relates to a semiconductor device and a method for manufacturing the same. More particularly, the invention relates to technology useful for a semiconductor device including a ferroelectric capacitor to realize a smaller configuration.

2. Description of Related Art

As a larger scale integration and smaller configuration of a semiconductor device have been achieved in recent years, a cross-point FeRAM has drawn attention as a semiconductor device having ferroelectric capacitors. In the cross-point FeRAM, an upper electrode layer and a lower electrode layer laid out in a matrix are deposited with a ferroelectric layer therebetween, and a ferroelectric capacitor is provided at each intersection of the upper electrode layer and the lower electrode layer. See, for example, Japanese Unexamined Patent Publication No. 9-116107.

SUMMARY OF THE INVENTION

The above-mentioned cross-point FeRAM, an upper electrode layer and a lower electrode layer are highly densely laid out in a matrix to realize a chip downsizing. Therefore, a contact hole that connects a peripheral circuitry, such as metal oxide semiconductor (MOS), placed under a capacitor forming region in the cross-point FeRAM to an outside wiring layer is generally provided on an area excluding the capacitor forming region. As a result, it is inevitable to allocate a large region for forming the peripheral circuitry in a construction of the cross-point FeRAM, which leaves much to be improved from a further chip downsizing point of view.

The invention aims to provide a semiconductor device and a method for manufacturing the same that are capable of contributing to a further chip downsizing in the cross-point FeRAM. Specifically, a semiconductor device of the invention can include a ferroelectric capacitor provided each at an intersection of a lower electrode layer extending in a first direction and an upper electrode layer extending in a second direction, and the semiconductor element formed on a semiconductor substrate located directly under the ferroelectric capacitor, and the plurality of interlayer insulating layers formed between a layer where the ferroelectric capacitor is formed and a layer where the semiconductor element is formed. Also, a local wiring is formed among a plurality of interlayer insulating layers located directly under a ferroelectric capacitor so as to couple a semiconductor element with a peripheral circuitry.

Also, in the semiconductor device of the invention, the plurality of interlayer insulating layers can include three and more layers and the local wiring is formed as two and more layers in the plurality of interlayer insulating layers Moreover, in the semiconductor device of the invention, the local wiring couples the semiconductor element with any one of the upper electrode layer and the lower electrode layer.

Also, in the semiconductor device of the invention, the local wiring can couple another wiring layer with the semiconductor element.

Further, in the semiconductor device of the invention, the local wiring can couple among a plurality of the semiconductor elements.

Additionally, in the semiconductor device of the invention, the local wiring can be made of a heat-resistant metal.

As for the heat-resistant metal of the invention, any material may be employed as far as it can withstand the high temperature annealing treatment of the ferroelectric layer. Examples of such metals may include tungsten, titanium nitride, and copper.

A method for manufacturing a semiconductor device according to the invention can include a step of forming a first interlayer insulating layer on the whole upper surface of a semiconductor substrate where a semiconductor element has been formed, a step of forming a first contact hole coupling the semiconductor element with one peripheral circuitry in the first interlayer insulating layer, a step of forming a first local wiring on part of the first interlayer insulating layer including an upper surface of the first contact hole after filling the first contact hole with a conductive element, and a step of forming a second insulating layer on the whole upper surface of the first insulating layer on which the first local wiring has been formed. The method can further include a step of forming a second contact hole coupling the semiconductor element with another peripheral circuitry in the second interlayer insulating layer and in the first interlayer insulating layer, and a step of forming a second local wiring on part of the second interlayer insulating layer including an upper surface of the second contact hole after filling the second contact hole with the conductive element. Additionally, the method can include a step of forming a ferroelectric capacitor provided in multiple numbers, each provided at an intersection of a lower electrode extending in a first direction and an upper electrode extending in a second direction, on the second interlayer insulating layer on which the second local wiring has been formed. The method is for manufacturing a semiconductor device in which the ferroelectric capacitor is provided each at an intersection of a lower electrode layer extending in a first direction and upper electrode layer extending in a second direction, and the semiconductor element is formed on a semiconductor substrate located directly under the ferroelectric capacitor, and the plurality of interlayer insulating layers are formed between the layer where the ferroelectric capacitor is formed and the layer where the semiconductor element is formed.

Here, in the method for manufacturing a semiconductor device according to the invention, it is preferable that at least one of the one peripheral circuitry and another peripheral circuitry is a circuitry coupling the semiconductor element with any one of the upper electrode layer and the lower electrode layer. With such a semiconductor device according to the invention, the local wiring can be formed among a plurality of interlayer insulating layers located directly under the ferroelectric capacitor so as to couple the semiconductor device with the peripheral circuitry. Examples of the peripheral circuitry can include a circuitry that couples the semiconductor element with the upper electrode layer or the lower electrode layer of the ferroelectric capacitor, a circuitry couples the semiconductor element with another wiring layer, and a circuitry couples the semiconductor element with an adjacent another semiconductor element. Thus, it is possible to form at least the part of the peripheral circuitry that connects to the semiconductor element, directly under the capacitor array forming region. As a result, this makes it possible to substantially reduce the peripheral circuitry forming region excluding the capacitor array forming region, and thereby serving to downsize a chip.

Also, in the semiconductor device of the invention, the plurality of interlayer insulating layers include three and more layers and the local wiring is formed as two and more layers in the plurality of interlayer insulating layers. Therefore, it is possible to form the semiconductor element that is capable of connecting to the peripheral circuitry using only the local wiring directly under the ferroelectric capacitor forming region, and thereby serving to downsize a chip further.

Moreover, in the semiconductor device of the invention, the local wiring is made of the heat-resistant metal that withstands high temperature annealing treatment of the ferroelectric layer. This makes it possible to suppress the deterioration of the product performance.

Further, in the method for manufacturing a semiconductor device of the invention, the plurality of interlayer insulating layers include three and more layers and the local wiring is formed as two and more layers in the plurality of interlayer insulating layers. This makes it possible to manufacture the semiconductor device that is capable of further downsizing the chip.

BRIEF DESCRIPTION OF THE DRAWINGS

The invention will be described with reference to the accompanying drawings, wherein like numerals reference like elements, and wherein:

FIG. 1 shows a configuration example of a semiconductor device of the invention where

DETAILED DESCRIPTION OF PREFERRED EMBODIMENTS

Embodiments of the invention will now be described with reference to the accompanying drawings.

Figure 1A:
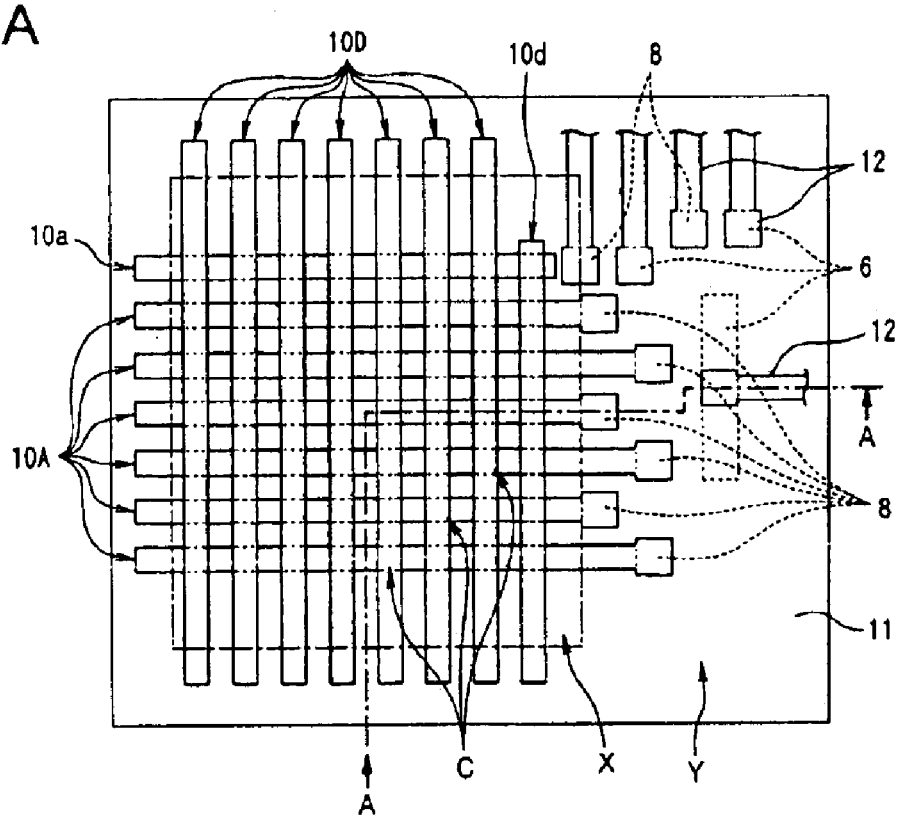
FIG. 1(a) is a plan view.
Figure 1B:
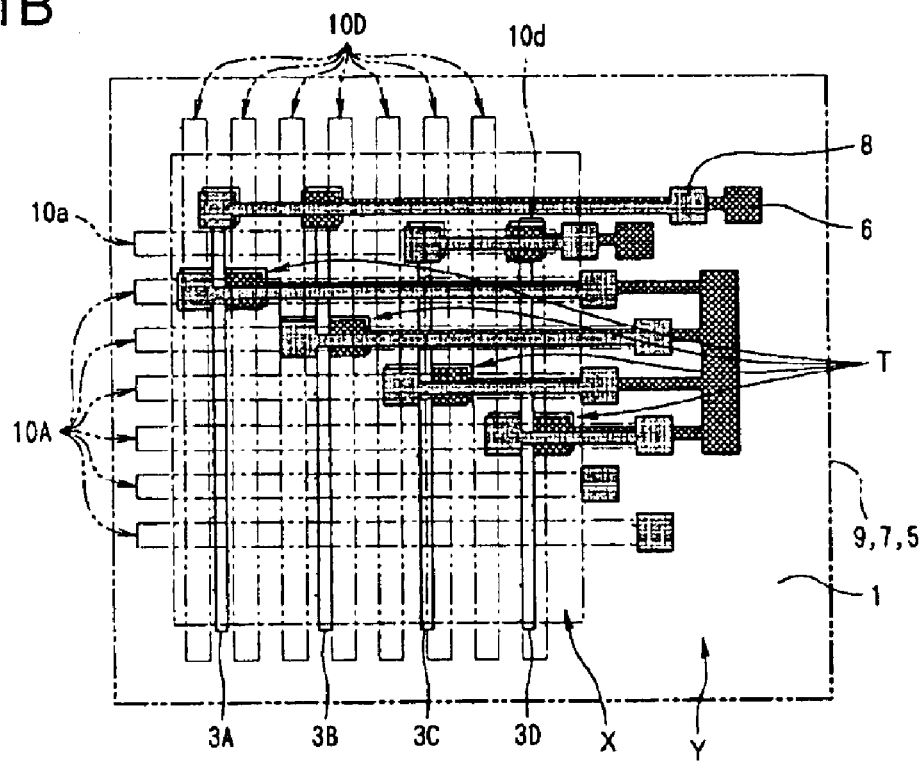
FIG. 1(b) is a diagram illustrating a wiring condition directly under a ferroelectric capacitor shown in FIG. 1(a)
Figure 2:
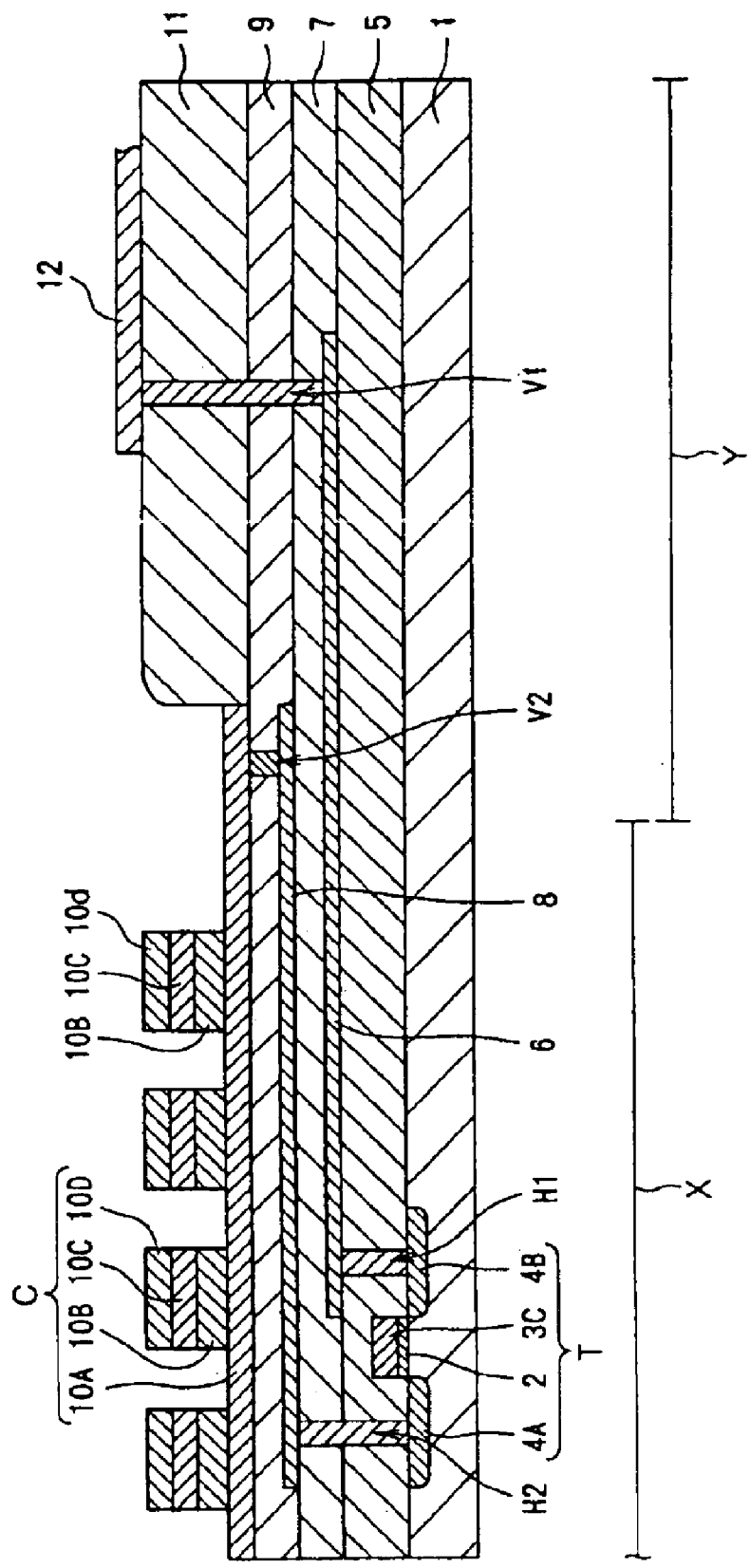
FIG. 2 is a partial enlarged cross sectional view taken along line A—A in a semiconductor device shown in FIG. 1.

FIG. 1 shows a configuration example of a semiconductor device of the invention. FIG. 1(a) is a plan view, FIG. 1(b) is a diagram illustrating a wiring condition directly under a ferroelectric capacitor shown in FIG. 1(a). FIG. 2 is a partial enlarged cross sectional view taken along line A—A in a semiconductor device shown in FIG. 1.

A semiconductor device of this embodiment, as shown in FIG. 1, has a cross-point FeRAM including a ferroelectric capacitor C provided in multiple numbers (forty-two pieces in this embodiment), each provided at an intersection of an upper electrode layer 10D provided in multiple numbers in rows (in the vertical direction of FIG. 1) and a lower electrode layer 10A provided in multiple numbers in columns (in the horizontal direction of FIG. 1) and a MOS transistor T provided in multiple numbers (four pieces in this embodiment) on a semiconductor substrate (silicon substrate) 1 located directly under a capacitor forming region X where the ferroelectric capacitor is provided in multiple numbers. Here, in FIG. 1, 10a shows a dummy lower electrode layer and 10d shows a dummy upper electrode layer. The dummy lower electrode 10a and the dummy upper electrode layer 10d are provided to improve a processing accuracy of the ferroelectric capacitor C and are not connected to a peripheral circuitry.

The MOS transistor T, as shown in FIG. 2, includes a gate electrode 3C, formed on a silicon substrate 1 through a gate insulating film 2, and a source region 4A and a drain region 4B that are each formed across the gate electrode 3C on an upper layer of the silicon substrate 1.

A first interlayer insulating layer 5 is formed on the whole upper surface of the silicon substrate 1 where the MOS transistor T is formed. A first local wiring 6 is formed on the region that is at least located above the drain region 4B and is on the first interlayer insulating layer 5.

The first local wiring 6 connects with the drain region 4B through a first contact-hole H1 provided in the first interlayer insulating layer 5 in the capacitor forming region X. Also, the first local wiring 6 connects with a top layer wiring (another wiring excluding local wirings) 12 through a first via hole V1 provided reaching from a second interlayer insulating layer to a fourth interlayer insulating layer 7, 9, 11 in a peripheral circuitry forming region Y.

The second interlayer insulating layer 7 is formed on the whole upper surface of the first interlayer insulating layer 5 where the first local wiring 6 is formed. A second local wiring 8 is formed on the region that is at least located above the source region 4A and is on the second interlayer insulating layer 7.

The second local wiring 8 connects with the source region 4A through a second contact-hole H2 provided in the first interlayer insulating layer and the second interlayer insulating layer 5, 7 in the capacitor forming region X. Also, the second local wiring 8 connects with the lower electrode layer 10A through a second via hole V2 provided in the third interlayer insulating layer 9 in a peripheral circuitry forming region Y.

The ferroelectric capacitor C, as shown in FIG. 2, includes the lower electrode layer 10A, the ferroelectric layer 10B, the upper electrode supporting layer 10C and the upper electrode layer 10D that is provided in this order on the third interlayer insulating layer 9 formed on the silicon substrate 1 through the first and second interlayer insulating layer 5, 7.

Here, as shown in FIG. 1(a), the fourth interlayer insulating layer 11 is formed on the third interlayer insulating layer 9 excluding the region for forming the lower electrode layer 10A. The fourth interlayer insulating layer 11 is formed under the upper electrode layer 10D excluding the ferroelectric capacitor C. On the other hand, surface of the lower electrode layer 10A exposes on the region where the lower electrode layer 10A has been formed excluding the ferroelectric capacitor C.

The top layer wiring 12 is formed on the region that is at least located above the first local wiring 6 and is on the fourth interlayer insulating layer 11 in the peripheral circuitry forming region Y. Here, the first and second local wiring are made of, for example, a heat-resistant metal such as tungsten (W), titanium nitride (TiN), copper (Cu).

A method for manufacturing a semiconductor device in this embodiment will now be described. FIG. 3 is a sectional view illustrating one process of manufacturing the semiconductor device according to the invention. FIG. 3 is a sectional view taken along line A—A in the semiconductor device shown in FIG. 1 in each process.

In the method for manufacturing the semiconductor of the embodiment, firstly, a gate insulating film 2 is deposited to be 10 nm thick on a silicon substrate 1 by using a known thermal oxidation method. Next, by using a known chemical vapor deposition (CVD) method, a polysilicon, which become each gate electrode 3A, 3B, 3C, 3D, is deposited to be 300 nm thick on the gate insulating film 2. Then, the required gate electrode 3A, 3B, 3C, 3D is provided by using a known photolithography and etching technique.

Next, by using each gate electrode 3A, 3B, 3C, 3D as a mask for an ion implantation, an impurity ion implantation is performed so as to form a source region 4A and a drain region 4B located at both side of the each gate electrode 3A, 3B, 3C, 3D in a silicon substrate 1. As a result, a MOS transistor T is completed on the silicon substrate 1.

Figure 3A:
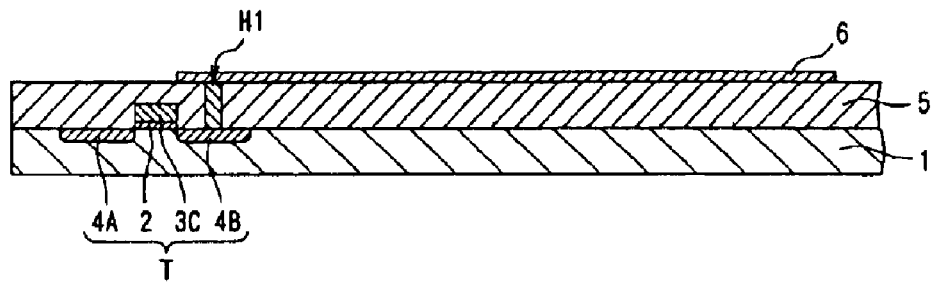
FIG. 3(a)–FIG. 3(d) are a sectional view illustrating one process of manufacturing the semiconductor device according to the invention.

Next, as shown in FIG. 3(a), by using a known CVD method, a first interlayer insulating layer 5 made, for example, of silicon oxide film is deposited to be 1500 nm thick on the whole upper surface of the silicon substrate 1 where the MOS transistor has been formed. Then, using a known photolithography and etching technique, a first contact hole H1 connected to the drain region 4B in the MOS transistor is formed in a first interlayer insulating layer 5. Subsequently, using a metal plug technique, tungsten (W) is filled in the first contact hole H1. Simultaneously, not shown in FIG. 3, contact holes connect to some of the gate electrodes (in this embodiment the gate electrode 3B, 3D) in a plurality of MOS transistors, are formed and filled with tungsten (W) in the same way.

Next, by using a known sputtering method, a film for a first local wiring 6 made, for example, of titanium nitride is deposited to be 200 nm thick on the first interlayer insulating layer 5. Then, by using a known photolithography and etching technique, the local wiring 6 is formed on the first interlayer insulating layer 5 including the region that is located at least above the drain region 4B in the MOS transistor T. Simultaneously, not shown in FIG. 3, the local wiring 6 is formed on the first interlayer insulating layer 5 including the region that is located above the gate electrode 3B, 3D connected to a contact hole formed in the first interlayer insulating layer 5.

Figure 3B:
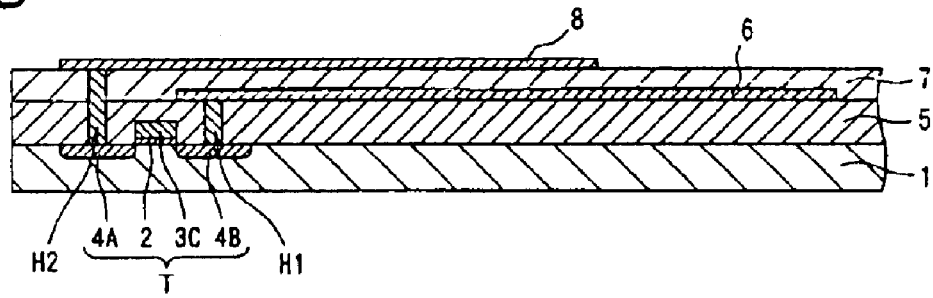

Next, as shown in FIG. 3(b), by using a known CVD method, the second interlayer insulating layer 7 is deposited to be 600 nm thick on the whole upper surface of the first interlayer insulating layer 5 where the first local wiring 6 has been formed. Then, by using a known photolithography and etching technique, the second contact hole H2 that connects to the source region 4A in the MOS transistor T is formed in the second interlayer insulating layer 7. Subsequently, using a metal plug technique, tungsten (W) is filled in the first contact hole H2. Simultaneously, not shown in FIG. 3, contact holes connect to some of the gate electrodes (in this embodiment the gate electrode 3A, 3C) are formed and filled with tungsten (W) in the same way.

Next, by using a known sputtering method, a film for a second local wiring 8 made, for example, of titanium nitride is deposited to be 200 nm thick on the second interlayer insulating layer 7. Then, by using a known photolithography and etching technique, the local wiring 8 is formed on the second interlayer insulating layer 7 including the region that is located at least above the source region 4A, the gate electrode 3A, and the gate electrode 3C in the MOS transistor T. Simultaneously, not shown in FIG. 3, the local wiring 8 is formed on the second interlayer insulating layer 7 including the region that is located above the gate electrode 3A, 3C connected to the contact hole formed in the second interlayer insulating layer 7 in the same way.

Figure 3C:
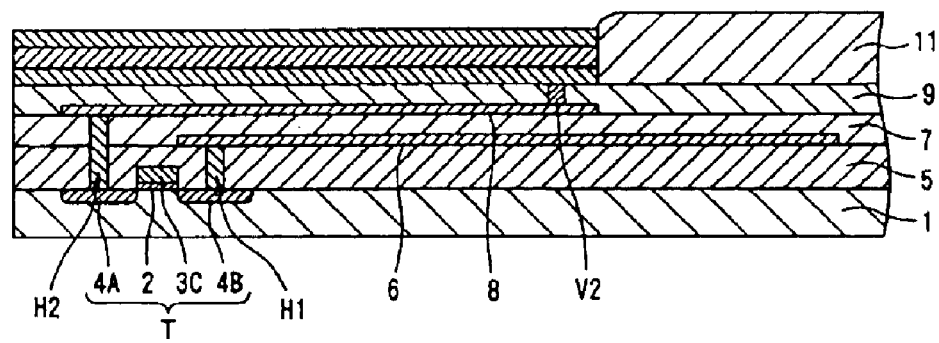

Next, as shown in FIG. 3(c), by using a known CVD method, a third interlayer insulating layer 9 is deposited to be 600 nm thick on the whole upper surface of the second interlayer insulating layer 7 where the second local wiring 8 has been formed. Then, by using a known photolithography and etching technique, a second via hole V2 that connects to the second local wiring 8 is formed in the third interlayer insulating layer 9. Subsequently, using a metal plug technique, tungsten (W) is filled in the second via hole V2.

Next, by using a known sputtering method for example, a lower electrode layer 10A made of Pt or the like, a ferroelectric layer 10B consisted of a ferroelectric film made of SBT ($SrBi_2Ta_2O_9$), PZT ($Pb(Zr_xTi_{1-x})O_3$) or the like, and an upper electrode supporting layer 10C made of Pt or the like are formed to a thickness of 200 mn each in this order on the whole surface of the third interlayer insulating layer 9. If an oxidation of the tungsten plug connected to the lower electrode 10A is great concerned, titanium aluminum nitride or the like, as a barrier layer for antioxidation, is deposited to be approximately 50 nm thick on the whole under surface of the lower electrode layer 10A by using a known sputtering method.

Next, by using a known photolithography and etching technique, the upper electrode supporting layer 10C, the ferroelectric layer 10B, and the lower electrode layer 10A are etched at once, and thus a multilayer for forming a capacitor made up of the lower electrode 10A, the ferroelectric layer 10B, and the upper electrode layer 10C can be provided in multiple numbers in columns (in the horizontal direction of FIG. 3) in the region for the lower electrode forming.

Next, a fourth interlayer insulating layer 11 made of silicon oxide or the like is deposited to be 1500 nm thick on the whole upper surface of the third interlayer insulating layer 9 where the multilayer for forming a capacitor is formed in the region for the lower electrode forming, by using a known CVD method. Then, planarization is accomplished on the whole upper surface of the fourth interlayer insulating layer 11 by using a known a chemical mechanical polishing (CMP) or an etching back for the whole surface or the like. As a result, the upper electrode supporting layer 10C in the multilayer for forming a capacitor exposes from the upper surface of the fourth interlayer insulating layer 11. Here, the fourth interlayer insulating layer 1 is formed on the third interlayer insulating layer 9 excluding the region for the lower electrode forming.

Figure 3D:
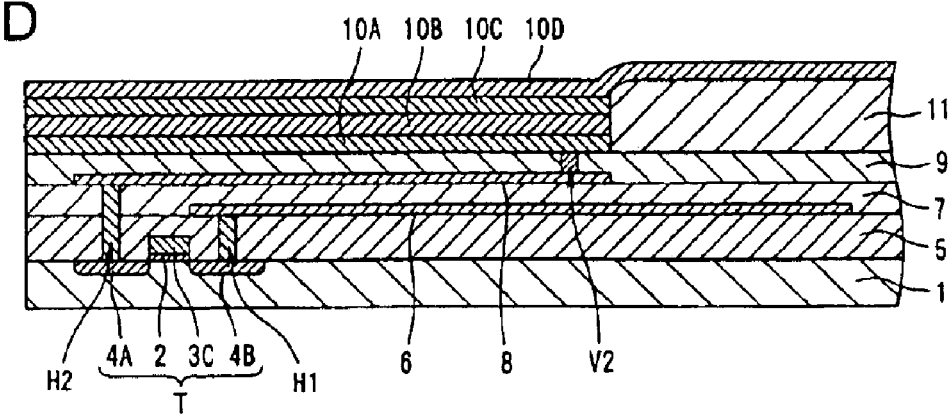

Next, as shown in FIG. 3(d), by using a known sputtering method, the upper electrode made of Pt can be deposited on the whole upper surface of the fourth interlayer insulating layer 11 where the planarization has been done. Then, as shown in FIG. 2, the upper electrode layer 10D, the upper electrode supporting layer 10C, and the ferroelectric layer 10B that is formed on and above the lower electrode 10A excluding the region for upper electrode forming are removed by using a known photolithography and etching technique. As a result, the upper electrode layer 10D is provided in multiple numbers in columns (in the direction perpendicular to the sectional view in FIG. 3(d)) on the region for upper electrode forming.

Thus, the ferroelectric capacitor made up of the lower electrode layer 10A, the ferroelectric layer 10B, the upper electrode supporting layer 10C and the upper electrode 10D can be formed at each intersection of the lower electrode layer 10A provide in columns and the electrode layer 10D provided in rows.

Next, a first via hole V1 connected to the first local wiring 6 is formed in the fourth interlayer insulating layer 11 located in a peripheral circuitry forming region Y. Then, the first via hole V1 is filled with a metal, such as tungsten, by using a known metal plug technique. Subsequently, a top layer wiring 12, that is made of aluminum for example, is deposited on the whole upper surface of the fourth interlayer insulating layer 11 by using a known sputtering method. Then, as shown in FIG. 1, by using a known photolithography and etching technique, the top layer wiring 12 connects to the first and second local wiring 6, 8 patterned from the capacitor array forming region X to the peripheral circuitry forming region Y.

According to the semiconductor device in this embodiment, the first local wiring 6 connects the all of the drain region 4B and the gate electrode 3B, 3D in the MOS transistor T and the top layer wiring 12. Also, the second local wiring 8 connects the all of the source region 4A in the MOS transistor T and the lower electrode layer 10A in the ferroelectric capacitor C, and further connects the gate electrode 3A, 3C in the MOS transistor T and the top wiring layer 12. Thus, this makes it possible to form a peripheral circuitry made up of the MOS transistor T directly under the capacitor array forming region X. As a result, this makes it possible to substantially reduce the peripheral circuitry forming region Y excluding the capacitor array forming region X and thus this serves to downsize a chip.

Also, according to the semiconductor device in this embodiment, the first and second local wiring are made of a heat-resistant metal that withstands a high temperature annealing treatment of the ferroelectric layer 10B. Therefore, this makes it possible to suppress a deterioration of the product performance.

Further, according to the method for manufacturing the semiconductor device, the semiconductor device in the invention can easily be realized.

While it is presupposed that a MOS transistor is connected with the ferroelectric capacitor C in the embodiments, it should be understood that any other semiconductor devices may replace this as far as they are connectable to the ferroelectric capacitor C. Examples of such devices may include metal insulator semiconductor (MIS) transistors, such as a metal-oxide-nitride-oxide-semiconductor (MONOS) transistor.

Also, while it is presupposed that local wiring is formed such as the first and second local wiring 6, 8 in the embodiment, it should be understood that the number of the local wirings may vary depending on a semiconductor device employed.

Moreover, in the embodiment, it is presupposed that the first local wiring 6 connects the all of the drain region 4B and the gate electrode 3B, 3D in the MOS transistor T and the top layer wiring 12, and further the second local wiring 8 connects the all of the source region 4A in the MOS transistor T and the lower electrode layer 10A in the ferroelectric capacitor C. Moreover, the second local wiring 8 connects the gate electrode 3A, 3C in the MOS transistor T and the top layer wiring 12. However, it should be understood that connecting system may vary depending on a circuit design.

What is claimed is:

1. A semiconductor device, comprising:
   a lower electrode layer extending in a first direction;
   an upper electrode layer extending in a second direction;
   a ferroelectric capacitor disposed at an intersection between the lower electrode and the upper electrode layer;
   a semiconductor element formed on a semiconductor substrate located directly under the ferroelectric capacitor;
   a plurality of interlayer insulating layers formed between a layer where the ferroelectric capacitor is formed and a layer where the semiconductor element is formed; and
   a local wiring layer formed among the plurality of interlayer insulating layers located directly under the ferroelectric capacitor so as to couple the semiconductor element with a peripheral device.

2. The semiconductor device according to claim 1, the plurality of interlayer insulating layers including three and more layers and the local wiring being formed as two and more layers in the plurality of interlayer insulating layers.

3. The semiconductor device according to claim 1, the local wiring coupling the semiconductor element with any one of the upper electrode layer and the lower electrode layer.

4. The semiconductor device according to claim 1, the local wiring coupling another wiring layer with the semiconductor element.

5. The semiconductor device according to claim 1, the local wiring coupling among a plurality of the semiconductor elements.

6. The semiconductor device according to claim 1, the local wiring being made of a heat-resistant metal.

7. A method for manufacturing a semiconductor device in which a ferroelectric capacitor is disposed at an intersection between a lower electrode layer extending in a first direction and an upper electrode layer extending in a second direction, and a semiconductor element is formed on a semiconductor substrate located directly under the ferroelectric capacitor, and a plurality of interlayer insulating layers are formed between a layer where the ferroelectric capacitor is formed and a layer where the semiconductor element is formed, the method comprising:
   forming a first interlayer insulating layer on an entire upper surface of the semiconductor substrate where the semiconductor element has been formed;
   forming a first contact hole coupling the semiconductor element with one peripheral circuitry in the first interlayer insulating layer;
   forming a first local wiring layer on part of the first interlayer insulating layer including an upper surface of the first contact hole after filling the first contact hole with a conductive element;
   forming a second insulating layer on an entire upper surface of the first insulating layer on which the first local wiring has been formed;
   forming a second contact hole coupling the semiconductor element with another peripheral circuitry in the second interlayer insulating layer and in the first interlayer insulating layer;
   forming a second local wiring layer on a part of the second interlayer insulating layer including an upper surface of the second contact hole after filling the second contact hole with the conductive element; and
   forming the ferroelectric capacitor provided in multiple numbers, each provided at the intersection of the lower electrode extending in the first direction and the upper electrode extending in the second direction, on the second interlayer insulating layer on which the second local wiring has been formed.

8. The method for manufacturing a semiconductor device according to claim 7, at least one of the one peripheral circuitry and the another peripheral circuitry being a circuitry coupling the semiconductor element with any one of the upper electrode layer and the lower electrode layer.

* * * * *